United States Patent
Loddenkötter et al.

(10) Patent No.: US 6,483,128 B2
(45) Date of Patent: Nov. 19, 2002

(54) CONNECTING DEVICE FOR POWER SEMICONDUCTOR MODULES WITH COMPENSATION FOR MECHANICAL STRESSES

(75) Inventors: Manfred Loddenkötter, Ibbenbüren; Thilo Stolze, Arnsberg, both of (DE)

(73) Assignee: Eupec Europaeische Gesellschaft f. Leistungshalbleiter mbH+CO. KG, Warstein-Belecke (DE)

( * ) Notice: Subject to any disclaimer, the term of this patent is extended or adjusted under 35 U.S.C. 154(b) by 0 days.

(21) Appl. No.: 09/793,793

(22) Filed: Feb. 26, 2001

(65) Prior Publication Data

US 2001/0025964 A1 Oct. 4, 2001

(30) Foreign Application Priority Data

Feb. 24, 2000 (DE) .......................... 100 08 572

(51) Int. Cl.[7] ........................ H01L 23/495; H01R 11/28
(52) U.S. Cl. ....................... 257/177; 439/853
(58) Field of Search ................ 439/853, 856–7, 439/876; 257/666–7, 669, 670, 671

(56) References Cited

U.S. PATENT DOCUMENTS

| 4,159,159 A | * | 6/1979 | Kaucic et al. | ............... 339/198 |
|---|---|---|---|---|
| 4,585,295 A | * | 4/1986 | Ackerman | ................... 339/258 |
| 5,097,317 A | * | 3/1992 | Fujimoto et al. | ............. 357/72 |
| 5,643,832 A | * | 7/1997 | Kim | .......................... 437/187 |
| 5,895,549 A | * | 4/1999 | Goto et al. | .................. 156/345 |
| 5,969,414 A | * | 10/1999 | Parthasarati et al. | ........ 257/675 |
| 6,073,971 A | * | 6/2000 | Weh et al. | ..................... 285/35 |
| 6,146,185 A | * | 11/2000 | Cole et al. | .................. 439/399 |
| 6,207,222 B1 | * | 6/2001 | Chen et al. | .................... 427/97 |
| 6,310,401 B1 | * | 10/2001 | Stoisiek et al. | ............. 257/782 |
| 6,324,072 B1 | * | 11/2001 | Lorenz et al. | .............. 361/803 |

FOREIGN PATENT DOCUMENTS

DE  199-28-578  * 6/1999  ........... H01L/29/40

* cited by examiner

Primary Examiner—Nathan J. Flynn
Assistant Examiner—Johannes P Mondt
(74) Attorney, Agent, or Firm—Laurence A. Greenberg; Werner H. Stemer; Ralph E. Locher

(57) ABSTRACT

A connecting device for power semiconductor modules with compensation for mechanical stresses includes a sleeve connected to a substrate and having a region with a given very small diameter. A wire pin is provided for insertion into the region of the sleeve during operation to form an electrical connection for a board. The wire pin has a diameter greater than the given diameter for clamping the wire pin upon insertion in the region. Axial freedom of movement of the wire pin in the sleeve makes it possible to avoid mechanical stresses resulting from different material characteristics when a temperature change takes place.

25 Claims, 2 Drawing Sheets

PRIOR ART

CONNECTING DEVICE FOR POWER SEMICONDUCTOR MODULES WITH COMPENSATION FOR MECHANICAL STRESSES

BACKGROUND OF THE INVENTION

Field Of The Invention

The invention relates to a connecting device for power semiconductor modules having a substrate and a housing with compensation for mechanical stresses which are caused by the effects of different material characteristics of components when a temperature change occurs.

Power semiconductors have been increasingly used in recent years in automobile electronics, energy management and, increasingly, for industrial drive and automation technology as well. As a rule, those power semiconductors are combined to form modules, which are matched to customer-specific requirements.

In such power semiconductor modules, individual electronic components are generally soldered to a ceramic substrate. In some cases, the ceramic substrate is in turn soldered to a baseplate (heat sink). That ensures adequate dissipation of heat from the electronic components during operation. An example of a bipolar transistor module with an integrated gate (IGBT) is described in detail below with reference to FIG. 5 and is disclosed in an article entitled "Zuverlässigkeit von Al-Dickdraht-Bondverbindungen", [Reliability of Aluminum Thick-Wire Bonded Connections] ISHM Conference Munich 1996, Auerbach, Schwarzbauer, Lammers, Lenninger, Sommer.

In order to make it possible to ensure reliable bonded connections in such a power semiconductor module, the connections have to be fixed in position by complex workpiece supports during the soldering process. That means that the production process is complex, and is subject to the influences of faults. Furthermore, when using such aluminum bonded connections, a maximum permissible current intensity is limited by a bonding wire length and a bonding wire diameter.

SUMMARY OF THE INVENTION

It is accordingly an object of the invention to provide a connecting device for power semiconductor modules with compensation for mechanical stresses, which overcomes the hereinafore-mentioned disadvantages of the heretofore-known devices of this general type and which makes direct contact with connections of a power semiconductor on a substrate, in order to compensate for thermally dependent mechanical stresses using simple measures.

With the foregoing and other objects in view there is provided, in accordance with the invention, a connecting device for power semiconductor modules, comprising a sleeve connected to a substrate of a power semiconductor module. The sleeve has a region with a given very small diameter. A wire pin is provided for insertion into the region of the sleeve during operation to form an electrical connection for a board. The wire pin has a diameter greater than the given diameter for clamping the wire pin upon insertion in the region.

In accordance with another feature of the invention, in order to improve insulation, the housing is formed of plastic.

In accordance with a further feature of the invention, the sleeve is soldered to the substrate. In this context, it is feasible for the sleeve to be soldered to the substrate together with further electronic components during one furnace run. This advantageously allows the power semiconductor module to be produced efficiently.

In accordance with an added feature of the invention, in order to prepare for soldering, the substrate is provided with surfaces which can be wetted and surround an etched trench disposed in the surface of the substrate. Furthermore, the substrate is printed with a paste solder. Before the furnace run or the soldering process, the sleeve is placed on the paste solder. The subsequent flowing of the paste solder during the furnace run results in surface-tension forces being produced between the surfaces which can be wetted and the sleeve. Those forces center the sleeve with respect to the etched trench. This allows the sleeve to be aligned on the substrate in a very simple manner and with very accurate position and orientation tolerances, thus further simplifying the production of the power semiconductor module.

As mentioned above, the wire pin is introduced into the sleeve which is connected to the substrate. The sleeve and the wire pin thus form a two-part plug system, which replaces the previously used bonded connections, that were described initially, between the substrate and the board. The wire pin is clamped firmly in the sleeve by the advantageous shaping of the sleeve.

In accordance with an additional feature of the invention, the wire pin can still be moved axially in the sleeve under the influence of external force. This refinement advantageously makes it possible, in a state in which an end of the wire pin that is opposite the sleeve is connected to a board and the power semiconductor module is fitted to this board, for disadvantageous mechanical stresses caused by temperature changes to be dissipated directly once again. A further advantage of this exemplary embodiment results from the fact that the wire pin can still be soldered until it is fitted on the board, since the wire pin is not introduced into the sleeve until after the furnace run.

A further advantage of the two-part plug system including the sleeve and the wire pin for electrical connection of the substrate to the board is furthermore that the maximum permissible current intensity between the substrate and the board is greater than with the previous bonded connections. The wire diameter and bonding wire length, which in the past have been critical parameters in terms of current capacity, are of only secondary importance with the plug system according to the invention.

In accordance with yet another feature of the invention, both the sleeve and the wire pin are formed of tinned copper or copper alloys, thus ensuring that these components can be soldered well. In this context, appropriate material selection is generally required for the sleeve and the wire pin in order to avoid damaging contact corrosion, such as that which occurs between iron and copper.

In accordance with yet a further feature of the invention, the sleeve includes a bottom section and a casing section, with the casing section in the simplest case having an essentially cylindrical shape, for example. This ensures that the wire pin is clamped adequately even without any need to comply with exact tolerances on the cylinder diameter. In order to improve the capability of inserting the wire pin, it is conceivable for the wire pin to be provided on its end section with a chamfer, which is used as an insertion incline. The two-part plug system mentioned above can thus advantageously be ensured even by this simple exemplary embodiment.

In accordance with yet an added feature of the invention, the casing section of the sleeve has a funnel shape, thus further simplifying the insertion of the wire pin. As an alternative thereto, in this exemplary embodiment, insertion inclines can also be provided on the wire pin. When configured in the shape of a funnel, the casing section has arms between which slots are formed for the situation where the substrate is subjected to a washing process after soldering. In this case the slots advantageously ensure that flux residue can escape from the interior of the sleeve, and can thus be removed without leaving any residue.

In accordance with a concomitant feature of the invention, the housing of the power semiconductor module is filled with silica gel to insulate the components. The slots mentioned above in this case allow air to escape from the silica gel in the region of the sleeve, thus ensuring reliable insulation.

The connecting device according to the invention is assembled by placing at least one sleeve on a paste solder which has been applied to the substrate, by heating the substrate together with the sleeve in order to solder the sleeve to the substrate, and by introducing a wire pin into the respective sleeve. An electrical connection is produced between the power semiconductor module and a board through the wire pin.

Other features which are considered as characteristic for the invention are set forth in the appended claims.

Although the invention is illustrated and described herein as embodied in a connecting device for power semiconductor modules with compensation for mechanical stresses, it is nevertheless not intended to be limited to the details shown, since various modifications and structural changes may be made therein without departing from the spirit of the invention as well as within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 4b is an elevational view of a development of the sleeve shown in FIG. 4a.

DESCRIPTION OF THE PREFERRED EMBODIMENTS

Figure 5:
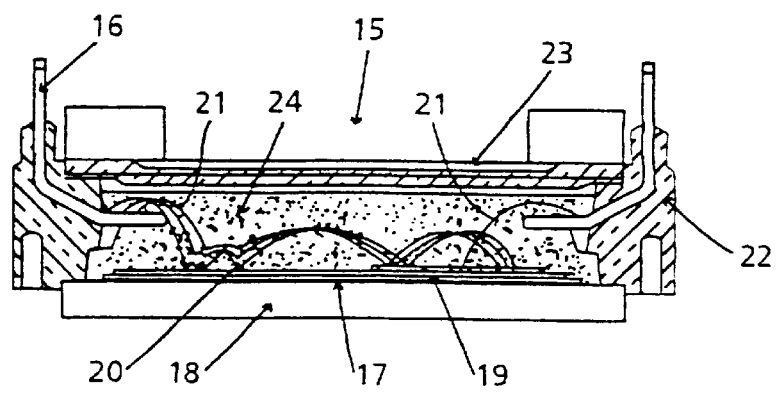
FIG. 5 is a sectional view of a power semiconductor module according to the prior art.

Referring now to the figures of the drawings in detail and first, particularly, to FIG. 5 thereof, there is seen a lateral sectional view of a prior art bipolar transistor module with an integrated gate (IGBT). As can be seen from this view, such a power semiconductor module 15 has silicone chips 19, which are soldered onto a ceramic substrate 17. The ceramic substrate 17 is in turn soldered to a baseplate 18. The silicone chips 19 are electrically connected to one another through the use of aluminum wires 20. Furthermore, pins 16 are passed outward on the sides of a housing 22, and are soldered to a non-illustrated board during a subsequent assembly process. Additionally, the components of the module are potted by using a silica gel 24 for electrical insulation. The housing 22 of the power semiconductor module 15 is closed by a cover 23.

Furthermore, aluminum bonded connections 21 are provided in the module 15 in order to ensure an electrical connection between the silicone chips 19 through the pins 16 and the board. In this case, ends of these bonded connections are each soldered firstly to the silicone chips 19 and secondly to balcony-like sections of the pins 16. As can be seen in FIG. 5, the aluminum bonded connections 21 assume a curved loop shape. Such so-called expansion loops or compensation sections are required in order to avoid disadvantageous mechanical stress influences, which occur due to different material characteristics of the components, when a temperature change occurs.

Figure 1:
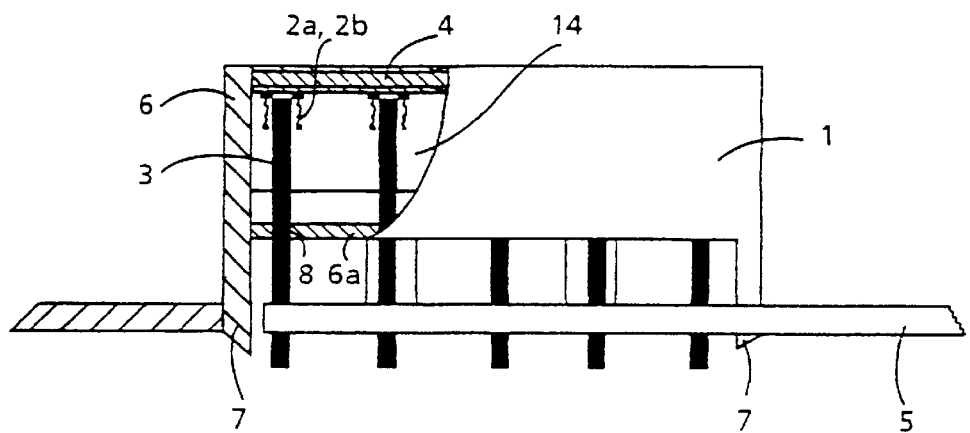
FIG. 1 is a diagrammatic, partly broken-away, side-elevational view of a power semiconductor module according to the invention, which is connected to a board.

FIG. 1 is a partially broken-away illustration of power semiconductor module 1 according to the invention, having a substrate 4 and a housing 6. In the broken-away region, it can be seen that at least one sleeve 2a, 2b is connected to the substrate 4. In this exemplary embodiment, the sleeve 2a, 2b is preferably soldered to the substrate 4. Furthermore, at least one wire pin 3 is introduced into each of the sleeves 2a, 2b in such a manner that it extends approximately at right angles to a surface of the substrate 4. In this case, another free end of the wire pin 3, which has not been introduced into the sleeve 2a, 2b, is used for electrical connection of the substrate 4 to a board 5.

In the exemplary embodiment of the invention illustrated in FIG. 1, the power semiconductor module 1 is fitted on the board 5 by connecting devices 7 on the housing 6. In the exemplary embodiment shown herein, the free end of the wire pin 3 is preferably soldered to the board 5. The housing 6 furthermore has the connecting devices 7 in order to ensure that the power semiconductor module 1 is fitted securely to the board 5. In this exemplary embodiment of the invention, the connecting devices 7 preferably are plastic snap-action hooks, which are clipped into the board 5. The housing 6 also has an upper housing surface 6a in which at least one opening 8 is provided. The upper housing surface 6a is preferably formed integrally with the housing 6 in this exemplary embodiment. As an alternative to this, the upper housing surface 6a may also include an individual element which is connected to the housing 6.

As can be seen from FIG. 1, the wire pin 3 extends through the opening 8 in the upper housing surface 6a. The wire pin 3 is passed out of the housing 6 in this way. Since the wire pin 3 extends through the opening 8 in the upper housing surface 6a, this furthermore ensures additional guidance for the wire pin 3. Since the upper housing surface 6a in this exemplary embodiment is preferably composed of plastic in the same way as the housing 6, this ensures reliable insulation of the above-mentioned components. Furthermore, the space between the substrate 4 and the upper housing surface 6a is filled with a silicone gel 14, which ensures further improved insulation of a possibly large number of sleeves 2a, 2b and wire pins 3 from one another. In this exemplary embodiment, the housing 6 is filled with the silica gel 14 in such a manner that a cavity remains between the silica gel 14 and the upper housing surface 6a.

Figure 2:
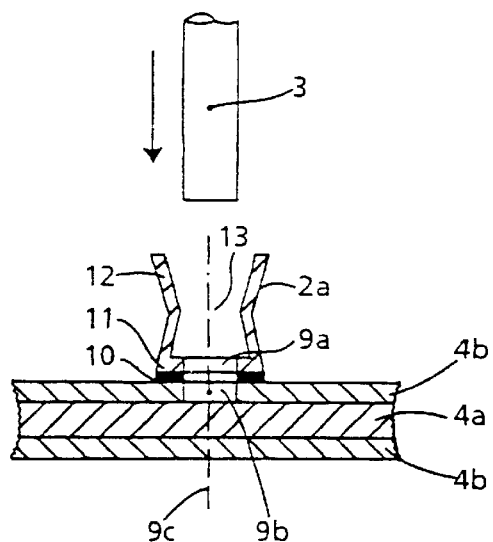
FIG. 2 is an enlarged, fragmentary, partly-sectional view of a sleeve connected to a substrate and of a wire pin of the power semiconductor module shown in FIG. 1.

In order to assist understanding of the invention, the fundamental layout of the substrate 4 together with a sleeve 2a and the wire pin 3 are shown on an enlarged scale in FIG. 2, which is a lateral sectional view. The substrate 4 includes a ceramic layer 4a, which is held layer-wise between two copper layers 4b. As can clearly be seen, the copper layer 4b facing the sleeve 2a has an etched trench 9b which is surrounded by non-illustrated surfaces that can be wetted metallically. A bottom section 11 of the sleeve 2a has a central hole 9a corresponding to the etched trench 9b.

When a paste solder 10 printed on the substrate 4 starts to flow during heating, surface-tension forces acting between the surfaces (which can be wetted) of the substrate 4 and the lower surface of the bottom section 11 of the sleeve 2 result in the central hole 9a being automatically centered with the etched trench 9b provided in the copper layer 4b. FIG. 2 shows such centering of the central hole 9a with respect to the etched trench 9b. Furthermore, the sleeve 2a has individual arms 12 which extend approximately at right angles to the surface of the substrate 4. The arms 12 of this sleeve 2a are bent relative to those of the bottom section 11 in such a manner that the sleeve 2a forms a funnel shape. Furthermore, the arms 12 are curved in the direction of a center axis 9c of the sleeve 2a, 2b in such a manner that the sleeve 2a has a region 13 in the funnel shape with a very small diameter, which is slightly smaller than the diameter of the wire pin 3. The wire pin 3 can be inserted axially into the sleeve 2a, with a free end of the wire pin 3 facing the sleeve 2a being pushed past the region 13 where the sleeve 2a has a very small diameter, but without coming into contact with the bottom section 11. The diameter difference mentioned above in this case leads to the wire pin 3 being clamped in the region 13 where the diameter of the sleeve 2a is very small.

Figure 3:
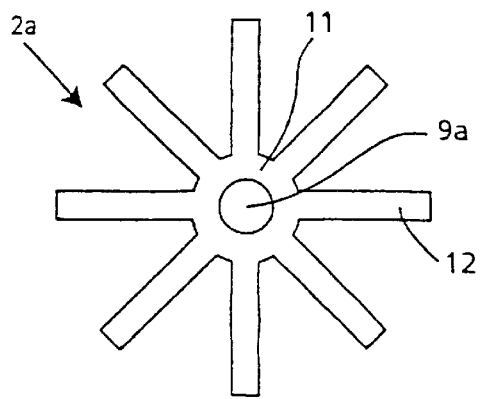
FIG. 3 is an elevational view of a star-shaped development of the sleeve used in FIG. 2.

FIG. 3 shows a development of the sleeve 2a of FIG. 2. It can be seen that a casing section of the sleeve 2a includes the arms 12 which are disposed in a star shape and extend radially outward from the edge of the bottom section 11 that surrounds the central hole 9a. For example, such a development could be stamped from a metal sheet or a strip without any major effort. The star-shaped arms 12 which extend radially outward from the edge of the bottom section 11 are then formed in such a manner that the sleeve 2a assumes the funnel shape shown in FIG. 2. As is evident from this star-shaped development, the sleeve 2a has slots between the arms 12 in the funnel shape. The slots ensure that any flux residues flow out during a washing process following the soldering. The slots furthermore ensure that, when introducing the silica gel 14 for potting, air can emerge in between, so that there are no undesirable air inclusions in the solidified silica gel 14.

Figure 4A:
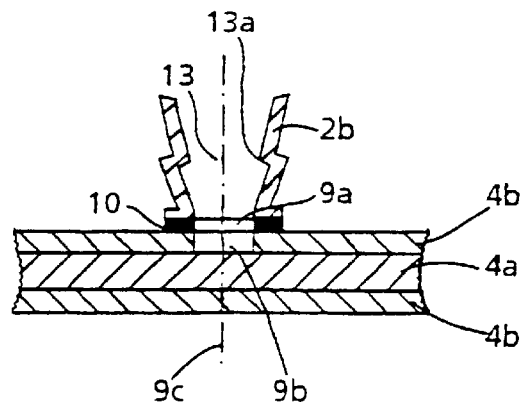
FIG. 4a is a sectional view of another exemplary embodiment of a sleeve connected to the substrate.
Figure 4B:
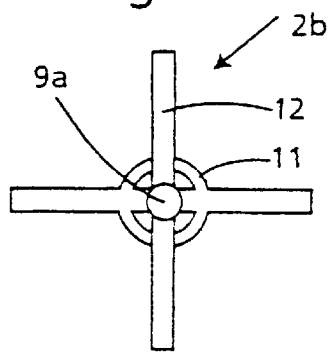

FIGS. 4a and 4b show an exemplary embodiment of a modified sleeve 2b. The fundamental layout of this sleeve 2b corresponds to that of the sleeve 2a. Identical features are annotated by the same reference symbols in this case, and will not be explained once again at this point. As can be seen in the lateral sectional view of FIG. 4a, this sleeve 2b has wedge sections 13a in the region 13 with a very small diameter. The wedge sections 13a each project radially inward with respect to the center axis 9c of the sleeve 2b at an acute angle. It is thus possible for the wire pin 3 to be clamped even more reliably than with the sleeve 2a, but without completely eliminating the axial freedom of movement of the wire pin in this case.

FIG. 4b shows a development of the casing section of the sleeve 2b. This figure shows that the casing section of the sleeve 2b is essentially formed from four arms 12 disposed in a cruciform shape. In the same way, the sleeve 2b can be stamped from a metal sheet or strip, with the production process for this sleeve 2b being simplified overall since there are fewer arms 12.

The method according to the invention is carried out by placing at least one sleeve 2a, 2b on a paste solder 10 applied to the substrate 4. The substrate 4 is heated together with the sleeve 2a, 2b, for example during a furnace run, in order to solder the sleeve 2a, 2b to the substrate 4. A wire pin 3 is then introduced into the respective sleeve 2a, 2b, and the power semiconductor module 1 is electrically connected to the board 5 through the wire pin 3.

The method according to the invention is carried out by centering a central hole 9a in the bottom section 11 of the sleeve 2a, 2b with respect to an etched trench 9b, which is disposed in the substrate 4, during the soldering process. This effect is due to surface-tension forces which are formed during the heating of the substrate 4 together with the sleeve 2a, 2b. The surface-tension forces act between the lower surface of the bottom section 13 of the sleeve 2a, 2b and the non-illustrated surfaces which can be wetted and are disposed on the side of the substrate 4 facing the sleeve 2a, 2b. In order to insulate what may be a large number of sleeves 2a, 2b and a corresponding number of wire pins 3 from one another in a suitable manner, the space between the sleeve 2a, 2b and the wire pin 3 is potted with silica gel 14 in accordance with the method according to the invention. The above-mentioned slots between the arms 12 of the sleeve 2a, 2b make it possible for air to be displaced through these slots, and to emerge from the silica gel 14 during the process of potting with the silica gel 14.

The present invention provides a power semiconductor module which is characterized by a simple construction and can be produced without major effort and with few method steps. The axial freedom of movement of the wire pin 3 in the sleeve 2a, 2b in this case ensures that no disadvantageous mechanical stresses can build up in the module in the event of temperature fluctuations to which the power semiconductor module is generally subjected during operation.

We claim:

1. In a connecting device for power semiconductor modules having a substrate, the improvement comprising:
   a board;
   a sleeve connected to the substrate, said sleeve having a region with a given diameter, said sleeve having a central hole formed therein, said sleeve being placed on surfaces of the substrate to be wetted metallically for centering said central hole with a trench etched in the substrate; and
   a wire pin for insertion into said region of said sleeve during operation to form an electrical connection for said board, said wire pin having a diameter greater than said given diameter for clamping said wire pin upon insertion in said region.

2. The connecting device according to claim 1, wherein said region with said given diameter is formed by a casing section of said sleeve having a star-shaped development.

3. The connecting device according to claim 1, wherein said region with said given diameter is formed by a casing section of said sleeve having a cruciform development.

4. The connecting device according to claim 2, wherein said development has arms to be bent for forming said sleeve into a funnel shape.

5. The connecting device according to claim 3, wherein said development has arms to be bent for forming said sleeve into a funnel shape.

6. The connecting device according to claim 4, wherein said arms of said sleeve define slots therebetween.

7. The connecting device according to claim 5, wherein said arms of said sleeve define slots therebetween.

8. The connecting device according to claim 1, wherein said region with said given diameter has wedge sections.

9. The connecting device according to claim 8, wherein said sleeve has a center axis, and said wedge sections project radially inward relative to said center axis at an acute angle.

10. The connecting device according to claim 1, wherein said sleeve is soldered to the substrate.

11. The connecting device according to claim 1, wherein said wire pin is axially movable in said sleeve under influence of a force.

12. The connecting device according to claim 2, wherein said casing section has a substantially cylindrical shape.

13. The connecting device according to claim 3, wherein said casing section has a substantially cylindrical shape.

14. The connecting device according to claim 1, wherein said sleeve has a bottom section with a central hole formed therein.

15. The connecting device according to claim 1, wherein the substrate has an etched trench.

16. The connecting device according to claim 1, wherein the substrate has an etched trench, and the surfaces to be wetted metallically surround the etched trench.

17. The connecting device according to claim 1, wherein the substrate is printed with a paste solder.

18. The connecting device according to claim 1, wherein said sleeve and said wire pin are formed of a material selected from the group consisting of tinned copper and copper alloys.

19. The connecting device according to claim 1, wherein the substrate is formed of ceramic.

20. The connecting device according to claim 1, including a housing filled with a silicon gel between said sleeve and said wire pin to ensure insulation.

21. The connecting device according to claim 20, wherein said housing has an upper housing surface with at least one opening formed therein through which said wire pin extends.

22. The connecting device according to claim 20, wherein said housing has a device to be fitted on said board, for connecting the power semiconductor module to said board.

23. The connecting device according to claim 22, wherein said device is formed from a snap-action hook.

24. The connecting device according to claim 20, wherein said housing is formed of plastic.

25. A power semiconductor module assembly, comprising:
 a substrate having surfaces to be wetted metallically and having an etched trench;
 a board;
 a sleeve connected to said substrate, said sleeve having a region with a given diameter, said sleeve having a central hole formed therein, said sleeve being placed on said surfaces of said substrate to be wetted for centering said central hole with said etched trench; and
 a wire pin for insertion into said region of said sleeve during operation to form an electrical connection for said board, said wire pin having a diameter greater than said given diameter for clamping said wire pin upon insertion in said region.

* * * * *